US006961249B2

(12) United States Patent
Wong

(10) Patent No.: US 6,961,249 B2
(45) Date of Patent: Nov. 1, 2005

(54) LATCHING APPARATUS FOR MOUNTING A COMPUTER MODULE

(75) Inventor: Henry Wong, Tempe, AZ (US)

(73) Assignee: Motorola, Inc., Schaumburg, IL (US)

( * ) Notice: Subject to any disclaimer, the term of this patent is extended or adjusted under 35 U.S.C. 154(b) by 218 days.

(21) Appl. No.: 10/426,484

(22) Filed: Apr. 30, 2003

(65) Prior Publication Data

US 2004/0218370 A1 Nov. 4, 2004

(51) Int. Cl.$^7$ .............................. H05K 7/14; H05K 7/18
(52) U.S. Cl. ..................... 361/801; 361/759; 361/754
(58) Field of Search ................................ 361/801, 759, 361/740, 732, 726, 747, 754, 686

(56) References Cited

U.S. PATENT DOCUMENTS

| 5,959,843 A | 9/1999 | Kurrer et al. ............... 361/754 |
| 6,128,198 A | 10/2000 | Kurrer et al. ............... 361/759 |
| 6,185,106 B1 * | 2/2001 | Mueller ...................... 361/798 |
| 6,741,479 B2 * | 5/2004 | Korber et al. .............. 361/801 |

FOREIGN PATENT DOCUMENTS

| DE | 4105948 C2 | 8/2001 |
| EP | 0832547 B1 | 1/1999 |

* cited by examiner

Primary Examiner—Randy W. Gibson
Assistant Examiner—Hung S. Bui
(74) Attorney, Agent, or Firm—Kevin D. Wills

(57) ABSTRACT

A latching apparatus (208, 408) for mounting a computer module (202, 402) in a holding fixture (103) is disclosed, where the computer module comprises a baseboard (204, 404) and a faceplate (206, 406). The latching apparatus includes a handle (210, 410) rotatably coupled to the baseboard, where the handle has an outer portion (214, 414) and an inner portion (216, 416), where the outer portion includes a locking pin (218, 418) substantially parallel to the faceplate, and where the handle is movable between a latched position (220, 420) and an unlatched position (221, 421). A retention spring mechanism (222, 422) having a latching portion (224, 424) and a positional portion (226, 426), where the latching portion springably retains the handle in the latched position by engaging the locking pin, and where the positional portion frictionally interfaces with the inner portion of the handle to engage the handle in any of a plurality of positions. Latching apparatus can also include a handle stop (240, 440) coupled to prevent the handle from opening past the unlatched position.

19 Claims, 3 Drawing Sheets

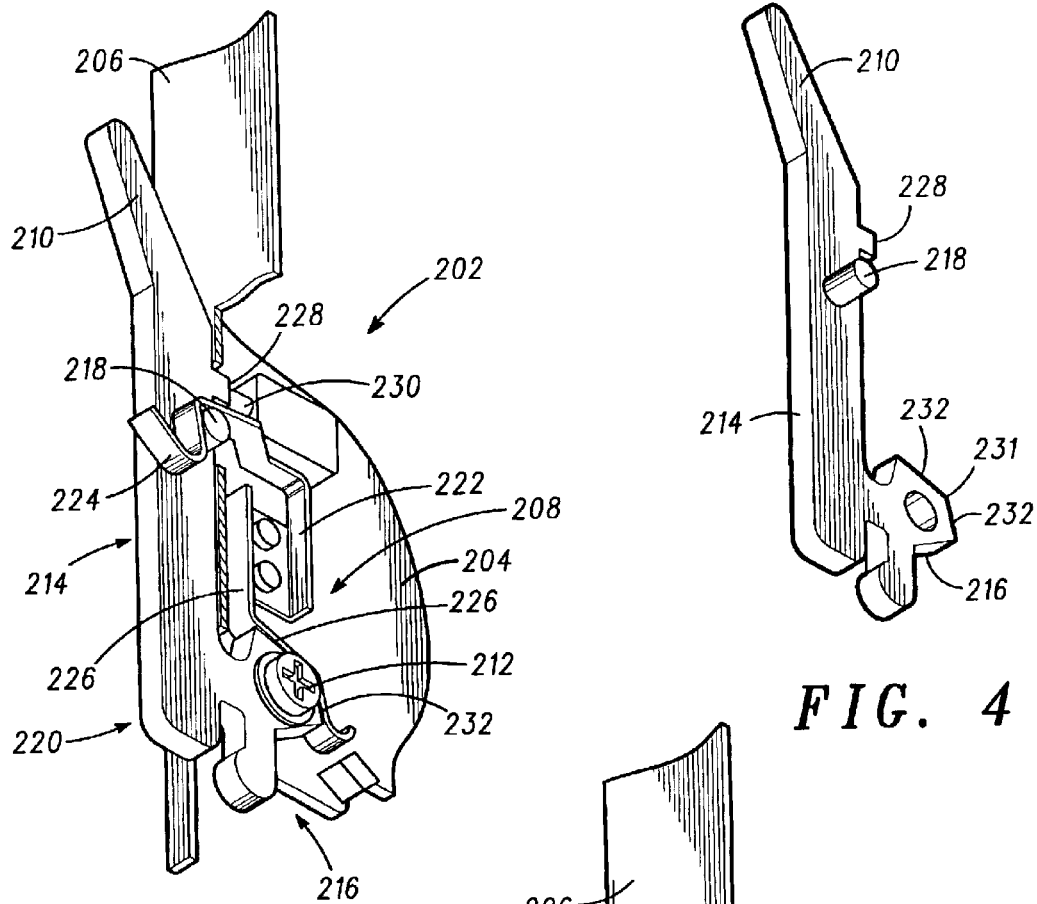
FIG. 2
FIG. 4
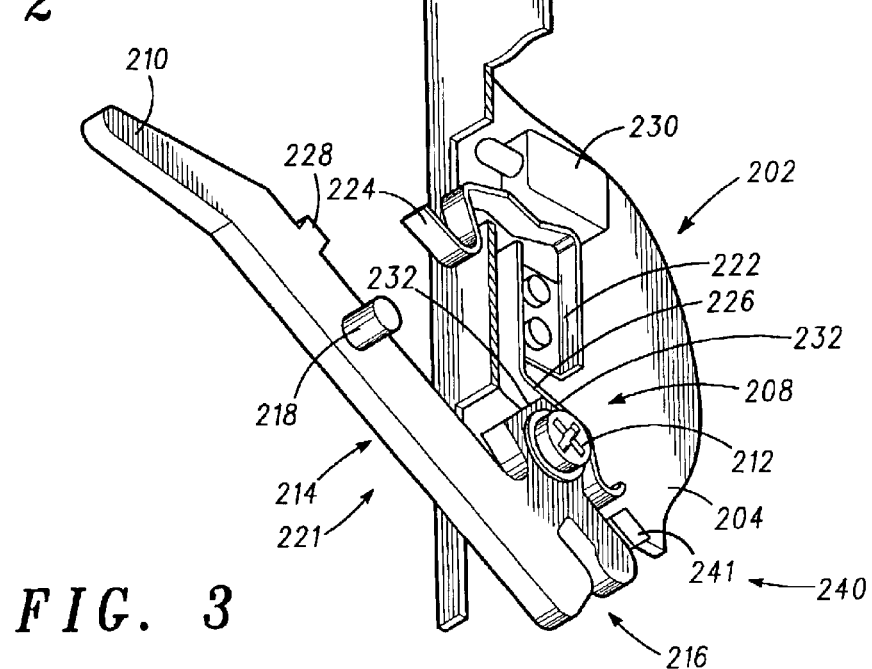
FIG. 3

LATCHING APPARATUS FOR MOUNTING A COMPUTER MODULE

BACKGROUND OF THE INVENTION

Printed circuit boards are frequently built as modules, which are pushed into holding fixtures. These holding fixtures can be, for example, frame or structural component carriers. The modules are predominately circuit boards, which are fitted with a large number of electronic components. On their backs, the modules have connectors, which, upon insertion of the module into the holding fixture, are mated with counter-connectors placed on the back of the holding fixture. These connectors may be, for example, coaxial connectors or socket boards with a large number of blade contacts. The insertion requires a considerable expenditure of force because of the relatively high friction resistances of the plug contacts. Likewise, for the removal of the module, the overcoming of the static friction and of the pulling-off forces is considerable. This static friction alone is not sufficient, however, to lock the module in the holding fixture in a vibration-secure manner. If elastic elements for the improvement of shielding are provided between the edge of the front plate of the module, which extends beyond the inside dimensions of the holding fixture, then forces are produced by these elements which can bring about a detachment of the module from the holding fixture.

Prior art modules provide latching mechanisms that are mechanically complex, expensive and do not provide for proper seating in a vibration-secure manner. In addition, prior art latching mechanisms do not provide desirable features such as an easy release locking mechanism, a means to secure the latching handle in any of a desired number of positions, especially in an unlatched position, or a means to limit latching handle rotation when the module is inserted or being removed from the structural component carrier.

Accordingly, there is a significant need for an apparatus and method that overcomes the disadvantages of the prior art outlined above.

BRIEF DESCRIPTION OF THE DRAWINGS

Referring to the drawing:

FIG. 2 is a computer module in accordance with an embodiment of the invention;

FIG. 3 is a computer module in accordance with another embodiment of the invention;

FIG. 4 is a handle in accordance with an embodiment of the invention;

Figure 1:
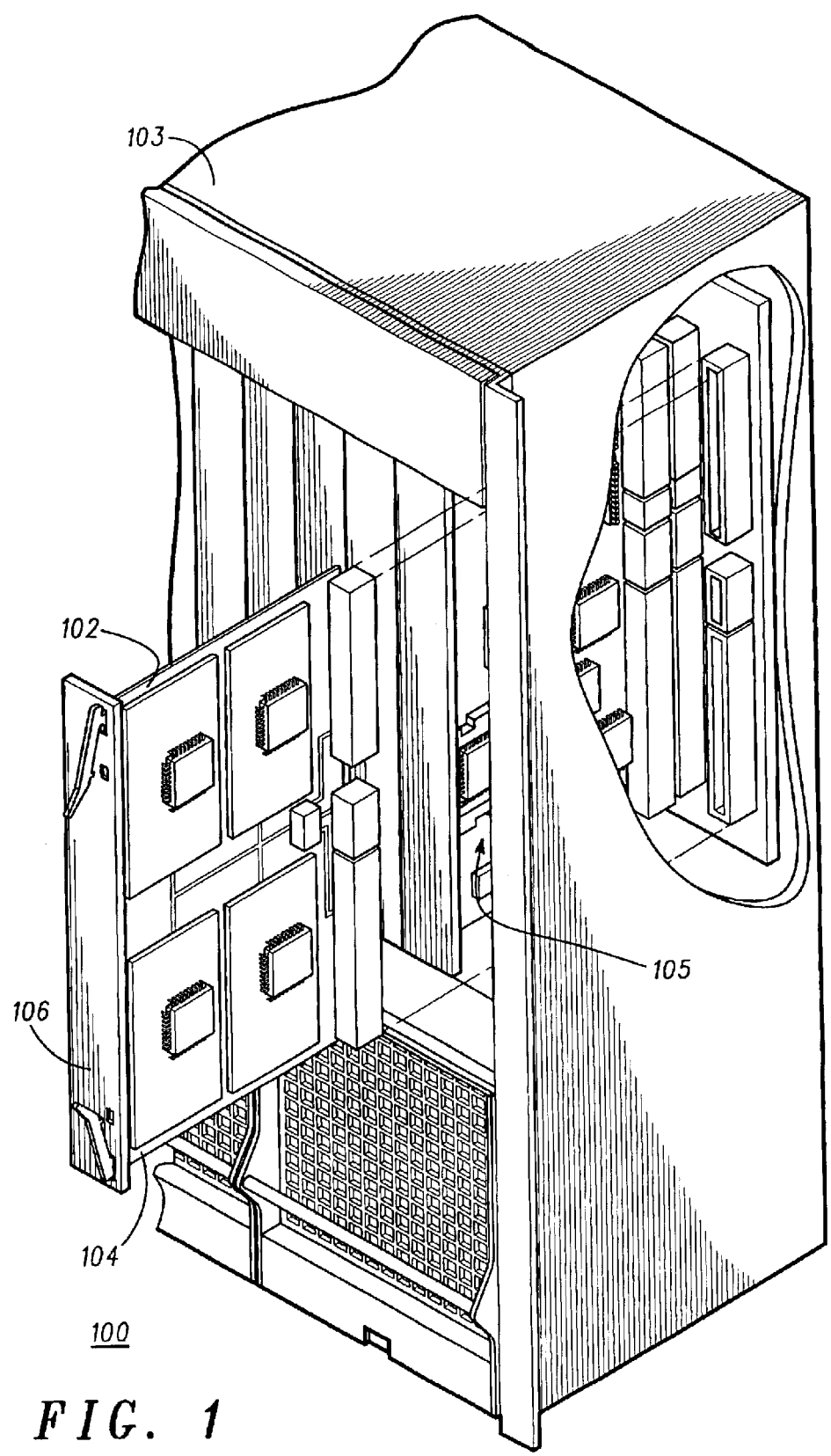
FIG. 1 is a block diagram of a computer system in accordance with an embodiment of the invention.

It will be appreciated that for simplicity and clarity of illustration, elements shown in the drawing have not necessarily been drawn to scale. For example, the dimensions of some of the elements are exaggerated relative to each other. Further, where considered appropriate, reference numerals have been repeated among the Figures to indicate corresponding elements.

DESCRIPTION OF THE PREFERRED EMBODIMENTS

In the following detailed description of exemplary embodiments of the invention, reference is made to the accompanying drawings, which illustrate specific exemplary embodiments in which the invention may be practiced. These embodiments are described in sufficient detail to enable those skilled in the art to practice the invention, but other embodiments may be utilized and logical, mechanical, electrical and other changes may be made without departing from the scope of the present invention. The following detailed description is, therefore, not to be taken in a limiting sense, and the scope of the present invention is defined only by the appended claims.

In the following description, numerous specific details are set forth to provide a thorough understanding of the invention. However, it is understood that the invention may be practiced without these specific details. In other instances, well-known circuits, structures and techniques have not been shown in detail in order not to obscure the invention.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical, electrical, or logical contact. However, "coupled" may mean that two or more elements are not in direct contact with each other, but yet still co-operate or interact with each other.

For clarity of explanation, the embodiments of the present invention are presented, in part, as comprising individual functional blocks. The functions represented by these blocks may be provided through the use of either shared or dedicated hardware, including, but not limited to, hardware capable of executing software. The present invention is not limited to implementation by any particular set of elements, and the description herein is merely representational of one embodiment.

FIG. 1 is a block diagram of a computer system 100 in accordance with an embodiment of the invention. As shown in FIG. 1, holding fixture 103 is designed to receive one or more computer modules 102. Holding fixture 103 can be, for example and without limitation, a computer chassis. Each computer module 102 can be inserted into, and interface with, holding fixture 103 via a slot 105. Holding fixture 103 can be designed to receive any number of computer modules 102. Computer module 102 can include a baseboard 104, on which can be mounted various electronic circuit components, for example and without limitation, a printed circuit board (PCB). Baseboard 104 can be sheet metal, plastic and the like. In another embodiment, baseboard 104 itself can be a PCB. Faceplate 106 is coupled to baseboard 104.

In one embodiment, a backplane in holding fixture 103 and computer module 102 each have a set of interlocking connectors designed to mate with each other when computer module 102 is placed in slot 105. Backplane can be used for connecting computer modules 102. As an example of an embodiment, computer system 100 can include holding fixture model MVME5100 manufactured by Motorola Computer Group, 2900 South Diablo Way, Tempe, Ariz. 85282. The invention is not limited to this model or manufacturer and any computer system and holding fixture is included within the scope of the invention.

In an embodiment of the invention, computer module 102 can be an Advanced Telecommunications Computer Architecture (AdvancedTCA™) module having an AdvancedTCA form factor. AdvancedTCA form factor, including mechanical dimensions, electrical specifications, and the like, are known in the art and set forth in the AdvancedTCA Specification, by PCI Industrial Computer Manufacturers Group (PCIMG), 301 Edgewater Place, Suite 220, Wakefield, Mass.

In another embodiment, computer module 102 can be a VMEbus computer module having a VMEbus form factor. VMEbus form factor, including mechanical dimensions, electrical specifications, and the like are known in the art and set forth in the ANSI/VITA 1-1994 and ANSI/VITA 1.1-1997 standards promulgated by the VMEbus International Trade Association (VITA), P.O. Box 19658, Fountain Hills, Ariz., 85269 (where ANSI stands for American National Standards Institute).

In yet another embodiment, computer module 102 can be a CompactPCI® board having a CompactPCI form factor. CompactPCI form factor, including mechanical dimensions, electrical specifications, and the like, are known in the art and set forth in the CompactPCI Specification, by PCI Industrial Computer Manufacturers Group (PCIMG™), 301 Edgewater Place, Suite 220, Wakefield, Mass.

In still yet another embodiment, computer module 102 can be an Advanced Packaging System (APS) board having an APS form factor. APS form factor, including mechanical dimensions, electrical specifications, and the like, are known in the art and set forth in the ANSI/VITA Specification 34.

FIG. 2 is a computer module 202 in accordance with an embodiment of the invention. As shown in FIG. 2, computer module 202 is comprised of baseboard 204 and faceplate 206 coupled substantially perpendicular to baseboard 204. In an embodiment, baseboard 204 can be a structural member onto which a PCB is mounted. In another embodiment, baseboard 204 can be a PCB. Faceplate 206 can include any number of connectors, switches, indicator lights, and the like that interface with electronic elements on baseboard 204.

Also depicted in FIG. 2, is latching apparatus 208. Latching apparatus 208 is shown in representative form in one lower front corner of baseboard 204. As depicted in FIG. 1, a corresponding latching apparatus is located on the upper front corner of computer module 202 (although not shown in FIG. 2 for clarity).

Latching apparatus 208 includes, among other things, a handle 210 rotatably coupled to baseboard 204 at a swivel shaft 212, where swivel shaft 212 is substantially perpendicular to faceplate 206. Handle 210 includes an outer portion 214 and an inner portion 216. Outer portion 214 is the portion of handle 210 on the outside of faceplate 206. Inner portion 216 of handle 210 is the portion on the inside of faceplate 206 where baseboard 204 is coupled to faceplate 206. Outer portion 214 includes a locking pin 218 substantially parallel to faceplate 206. Handle 210 is movable between latched position 220 and unlatched position 221 (shown in FIG. 3). Handle 210 moves between latched position 220 and unlatched position 221 by rotating about swivel shaft 212.

Latching apparatus 208 includes retention spring mechanism 222 having a latching portion 224 and a positional portion 226. In the embodiment shown in FIGS. 2 and 3, retention spring mechanism 222 is coupled to baseboard 204. In an embodiment, latching portion 224 springably retains handle 210 in latched position 220 by engaging locking pin 218. This securing prevents an unintended release of handle 210 by oscillation and shock stress. To accomplish this, latching portion 224 of retention spring mechanism 222 is bent substantially in a "U" shape, where upon movement of handle 210 into latched position 220, locking pin 218 moves along a slide incline of latching portion 224 "U" with latching portion 224 flexing upward until locking pin 218 snaps into the recesses of the "U" shape of latching portion 224. On the other hand, handle 210 can be released from retention spring mechanism 222 by lifting latching portion 224 of retention spring mechanism 222 and moving outer portion 214 of handle 210 away from faceplate 206 toward unlatched position 221, and thereafter releasing latching portion 224.

Positional portion 226 of retention spring mechanism 222 frictionally interfaces with inner portion 216 of handle 210 to engage handle 210 in any of a plurality of positions, where plurality of positions can include latched position 220, unlatched position 221 and any position between latched position 220 and unlatched position 221. In an embodiment, latched position 220 occurs when outer portion 214 of handle 210 is approximately zero degrees with faceplate 206. Unlatched position occurs when outer portion 214 of handle 210 is approximately sixty-five degrees with respect to faceplate 206.

In an embodiment, positional portion 226 can have a "U" shape such that spring tension in positional portion 226 causes contact with inner portion 216. Contact between inner portion 216 and positional portion 226 of retention spring mechanism 222 creates frictional resistance such that handle 210 can be statically held in any of a plurality of positions described above. In another embodiment, inner portion 216 can have a plurality of flat sides 232 to further aid in retaining handle 210 in any of plurality of positions through a frictional interface between inner portion 216 of handle 210 and positional portion 226 of retention spring mechanism 222.

In an embodiment, baseboard 204 can include switching element 230 such that switching element 230 is actuated when handle 210 substantially reaches latched position 220. In this way, PCB or other electronic elements on baseboard 204 can be rendered electrically active, for example by activation of an ON signal from switching element 230 that allows electronic components on computer module 202 to power ON. On the other hand, PCB or other electronic components on baseboard 204 can be rendered electrically passive when baseboard 204 is levered out of holding fixture 103. More specifically, PCB or other electronic components can be rendered electrically passive at the moment when handle 210 ceases to engage switching element 230. Thus for example, the release of switching element 230 by handle 210 moving out of latched position 220 can cause an electrical power supply to PCB or other electronic components to be made passive. In an embodiment of the invention, switching element can be any of electrical, mechanical, optical, magnetic, and the like.

This feature of the invention ensures that the application of stress onto baseboard 204 occurs only if all electrical connections to baseboard 204 have been made passive. This ensures that baseboard 204 can be pulled out of holding fixture 103 only if baseboard 204 and PCB or any electronic components thereon are in a secured switching state. This can be implemented in that switching element triggers data securing and/or electrical passive mode on baseboard 204 even before the pulling out of baseboard 204 from holding fixture 103. In this manner, a loss of information and disturbance peaks in electrical current on baseboard 204 or within a network system are avoided.

In an embodiment, handle 210 can include switching element contact point 228 coupled to engage switching element 230 affixed to baseboard 204. In one embodiment, switching element 230 can be affixed to a PCB, which is attached to baseboard 204. In another embodiment, baseboard 204 can itself be a PCB and switching element can be affixed to PCB. Switching element contact point 228 functions to engage or disengage switching element 230 to activate or deactivate electrical signals to computer module 202 as described above.

FIG. 3 is a computer module 202 in accordance with another embodiment of the invention. As shown in FIG. 3, latching apparatus 208, including handle 210, are in unlatched position 221. In an embodiment, latching apparatus 208 can include handle stop 240 coupled to prevent handle 210 from opening past unlatched position 221. In this particular embodiment, handle stop 240 comprises stop tab 241 coupled to baseboard 204. Stop tab 241 is elevated above the surface of baseboard 204 such that inner portion 216 of handle 210 contacts stop tab 241 when handle is in unlatched position 221. This has the advantage of preventing handle 210 from opening past unlatched position 221 and interfering with insertion of computer module 202 into holding fixture 103, and from handle 210 moving freely about when computer module 202 is free of holding fixture 103. In an embodiment of the invention, unlatched position 221 occurs when outer portion 214 of handle 210 is approximately sixty-five degrees from being parallel with faceplate 206. This unlatched position 221 is representative and is not limiting of the invention. Other unlatched positions are within the scope of the invention.

FIG. 4 is a handle 210 in accordance with an embodiment of the invention. Handle 210 is shown separately from latching apparatus 208 in FIG. 4 so as to better illustrate an embodiment of the invention. As shown in FIG. 4, inner portion 216 of handle 210 includes plurality of flat sides 232 to frictionally interface with retention spring mechanism 222 as described above to engage handle 210 in any of a plurality of positions. The interface portion 231 of any two adjacent plurality of sides 232 can engage into the valley portion of the "U" shape in positional portion 226 of retention spring mechanism 222 such that two of the adjacent plurality of sides 232 frictionally interface with sides of the "U" shape. With two adjacent plurality of sides 232 engaged in this manner, handle 210 can be held in one of a plurality of positions. By pulling or pressing on handle 210, positional portion 226 can flex allowing handle 210 to move to the next of plurality of positions.

Figure 5:
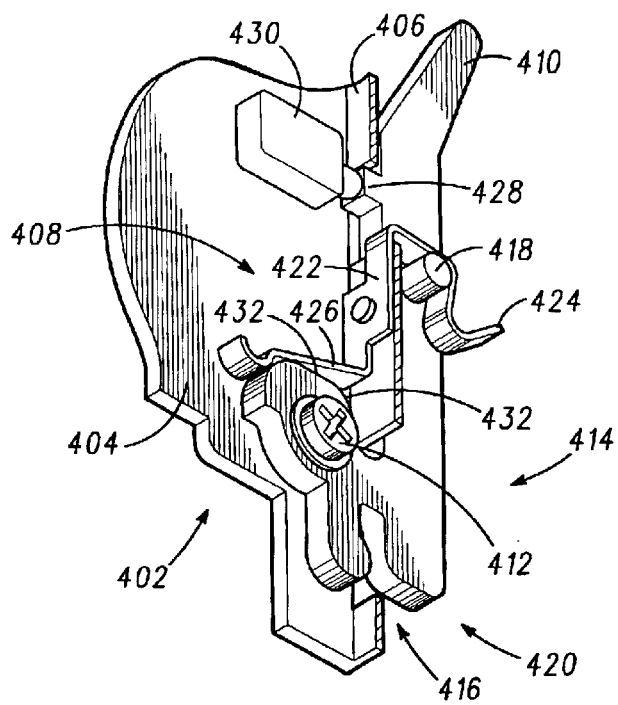
FIG. 5 is a computer module in accordance with yet another embodiment of the invention.

FIG. 5 is a computer module 402 in accordance with yet another embodiment of the invention. As shown in FIG. 5, computer module 402 is comprised of baseboard 404 and faceplate 406 coupled substantially perpendicular to baseboard 404. In an embodiment, baseboard 404 can be a structural member onto which a PCB is mounted. In another embodiment, baseboard 404 can be a PCB. Faceplate 406 can include any number of connectors, switches, indicator lights, and the like that interface with electronic elements on baseboard 404.

Also depicted in FIG. 5, is latching apparatus 408. Latching apparatus 408 is shown in representative form in one lower front corner of baseboard 404. As depicted in FIG. 1, a corresponding latching apparatus is located on the upper front corner of computer module 402 (although not shown in FIG. 2 for clarity).

Latching apparatus 408 includes, among other things, a handle 410 rotatably coupled to baseboard 404 at a swivel shaft 412, where swivel shaft 412 is substantially perpendicular to faceplate 406. Handle 410 includes an outer portion 414 and an inner portion 416. Outer portion 414 is the portion of handle 410 on the outside of faceplate 406. Inner portion 416 of handle 410 is the portion on the inside of faceplate 406 where baseboard 404 is coupled to faceplate 406. Outer portion 414 includes a locking pin 418 substantially parallel to faceplate 406. Handle 410 is movable between latched position 420 and unlatched position 421 (shown in FIG. 6). Handle 410 moves between latched position 420 and unlatched position 421 by rotating about swivel shaft 412.

Latching apparatus 408 includes retention spring mechanism 422 having a latching portion 424 and a positional portion 426. In the embodiment shown in FIGS. 5 and 6, retention spring mechanism 422 is coupled to faceplate 406. In particular, retention spring mechanism 422 is coupled to same side of faceplate 406 as baseboard 404. However, this arrangement is not limiting of the invention. In another embodiment, retention spring mechanism 422 can be coupled to the outer surface of faceplate 406.

In an embodiment, latching portion 424 springably retains handle 410 in latched position 420 by engaging locking pin 418. This securing prevents an unintended release of handle 410 by oscillation and shock stress. To accomplish this, latching portion 424 of retention spring mechanism 422 is bent substantially in a "U" shape, where upon movement of handle 410 into latched position 420, locking pin 418 moves along a slide incline of latching portion "U" with latching portion 424 flexing upward until locking pin 418 snaps into a one of the recesses of the "U" shape of latching portion 424. On the other hand, handle 410 can be released from retention spring mechanism 422 by lifting latching portion 424 of retention spring mechanism 422 and moving outer portion 414 of handle 410 away from faceplate 406 toward unlatched position 421, and thereafter releasing latching portion 424.

Positional portion 426 of retention spring mechanism 422 frictionally interfaces with inner portion 416 of handle 410 to engage handle 410 in any of a plurality of positions, where plurality of positions can include latched position 420, unlatched position 421 and any position between latched position 420 and unlatched position 421. In an embodiment, latched position 420 occurs when outer portion 414 of handle 410 is approximately zero degrees with faceplate 406. Unlatched position occurs when outer portion 414 of handle 410 is approximately sixty-five degrees with respect to faceplate 406.

In an embodiment, positional portion 426 can have a "U" shape such that spring tension in positional portion 426 causes contact with inner portion 416. Contact between inner portion 416 and positional portion 426 of retention spring mechanism 422 creates resistance such that handle 410 can be statically held in any of a plurality of positions described above. In another embodiment, inner portion 416 can have a plurality of flat sides 432 to further aid in retaining handle 410 in any of plurality of positions through a frictional interface between inner portion 416 of handle 410 and positional portion 426 of retention spring mechanism 422.

In an embodiment, baseboard 404 can include switching element 430 such that switching element 430 is actuated when handle 410 substantially reaches latched position 420. In this way, PCB or other electronic elements on baseboard 404 can be rendered electrically active, for example by activation of an ON signal from switching element 430 that allows electronic components on computer module 402 to power ON. On the other hand, PCB or other electronic components on baseboard 404 can be rendered electrically passive when baseboard 404 is levered out of holding fixture 103. More specifically, PCB or other electronic components can be rendered electrically passive at the moment when handle 410 ceases to engage switching element 430. Thus for example, the release of switching element 430 by handle 410 moving out of latched position 420 can cause an electrical power supply to PCB or other electronic components to be made passive. In an embodiment of the invention, switching element can be any of electrical, mechanical, optical, magnetic, and the like.

This feature of the invention ensures that the application of stress onto baseboard 404 occurs only if all electrical connections to baseboard 404 have been made passive. This ensures that baseboard 404 can be pulled out of holding fixture 103 only if baseboard 404 and PCB or any electronic components thereon are in a secured switching state. This can be implemented in that switching element triggers data securing and/or electrical passive mode on baseboard 404 even before the pulling out of baseboard 404 from holding fixture 103. In this manner, a loss of information and disturbance peaks in electrical current on baseboard 404 or within a network system are avoided.

In an embodiment, handle 410 can include switching element contact point 428 coupled to engage switching element 430 affixed to baseboard 404. In one embodiment, switching element 430 can be affixed to a PCB, which is attached to baseboard 404. In another embodiment, baseboard 404 can itself be a PCB and switching element can be affixed to PCB. Switching element contact point 428 functions to engage or disengage switching element 430 to activate or deactivate electrical signals to computer module 402 as described above.

Figure 6:
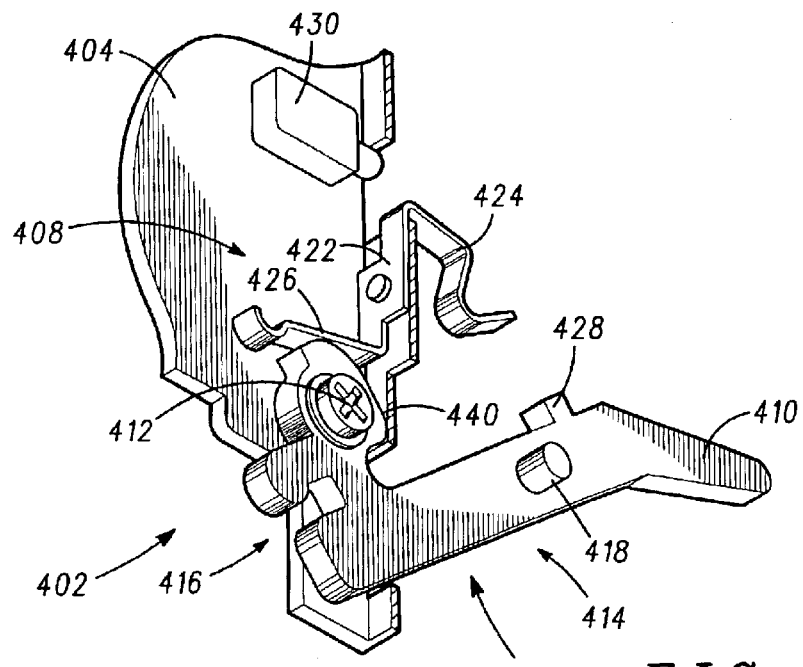
FIG. 6 is a computer module in accordance with still another embodiment of the invention.

FIG. 6 is a computer module 402 in accordance with another embodiment of the invention. As shown in FIG. 6, latching apparatus 408, including handle 410, are in unlatched position 421. In an embodiment, latching mechanism can include handle stop 440 coupled to prevent handle 410 from opening past unlatched position 421. In this particular embodiment, handle stop 440 is integral with inner portion 416 of handle 410. In this embodiment, inner portion 416 of handle 410 can include lobed portion 433 such that lobed portion 433 contacts faceplate 406 when handle 410 reaches unlatched position 421. Inner portion 416 can be formed such that it does not contact faceplate 406 until handle reaches unlatched position 421, whereupon lobed portion 433 contacts faceplate 406. In an embodiment, lobed portion 433 can be created by forming inner portion 416 of handle 410 a one or more different radius' of curvature about swivel shaft 412. By having a variable radius of curvature about swivel shaft 412, lobed portion 433 can be formed to prohibit handle 410 from opening past any given position, including unlatched position 421.

Lobed portion 433 prevents handle 410 from opening past unlatched position 421 and interfering with insertion of computer module 402 into holding fixture 103, and from handle 410 moving freely about when computer module 402 is free of holding fixture 103. In an embodiment of the invention, unlatched position 421 occurs when outer portion 414 of handle 410 is approximately sixty-five degrees from being parallel with faceplate 406. This unlatched position 421 is representative and is not limiting of the invention. Other unlatched positions are within the scope of the invention.

Figure 7:
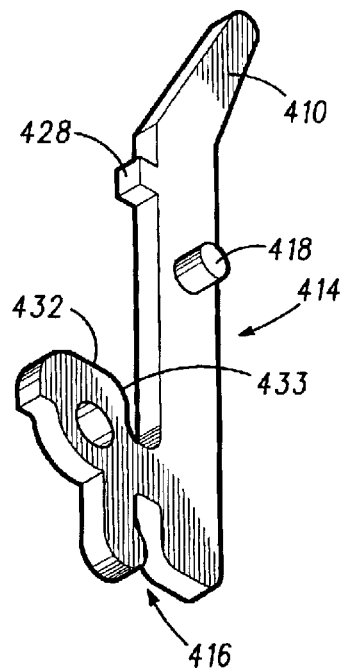
FIG. 7 is a handle in accordance with another embodiment of the invention.

FIG. 7 is a handle 410 in accordance with an embodiment of the invention. Handle 410 is shown separately from latching apparatus 408 in FIG. 6 so as to better illustrate an embodiment of the invention. As shown in FIG. 6, inner portion 416 of handle 410 can includes plurality of flat sides 432 and an interface portion (not shown for clarity) to frictionally interface with retention spring mechanism 422 as described above to engage handle 410 in any of a plurality of positions. Plurality of flat sides 432 and interface portion operate analogously as described with reference to FIG. 4. FIG. 7 also illustrates lobed portion 433 as described with reference to FIG. 6.

While we have shown and described specific embodiments of the present invention, further modifications and improvements will occur to those skilled in the art. It is therefore to be understood that appended claims are intended to cover all such modifications and changes as fall within the true spirit and scope of the invention.

What is claimed is:

1. A computer module, comprising:
   a baseboard having a swivel shaft;
   a faceplate substantially perpendicularly coupled to the baseboard, wherein the swivel shaft is substantially parallel to the facelate;
   a handle rotatably coupled to the baseboard at the swivel shaft, wherein the handle has an outer portion and an inner portion, wherein the outer portion includes a locking pin substantially parallel to the faceplate, and wherein the handle is movable between a latched position and an unlatched position;
   a retention spring mechanism having a latching portion and a positional portion, wherein the latching portion springably retains the handle in the latched position by engaging the locking pin, and wherein the positional portion frictionally interfaces with the inner portion of the handle to engage the handle in any of a plurality of positions; and
   a handle stop coupled to prevent the handle from opening past the unlatched position.

2. The computer module of claim 1, wherein the retention spring mechanism is coupled to the baseboard.

3. The computer module of claim 1, wherein the retention spring mechanism is coupled to the faceplate.

4. The computer module of claim 1, wherein the handle stop is comprised of a stop tab.

5. The computer module of claim 1, wherein the handle stop is integral with the inner portion of the handle.

6. The computer module of claim 5, wherein the inner portion of the handle couples with the faceplate to prevent the handle from opening past the unlatched position.

7. The computer module of claim 1, wherein the handle further comprises a switching element contact point coupled to engage a switching element affixed to the baseboard.

8. The computer module of claim 1, wherein the baseboard is a printed circuit board.

9. The computer module of claim 1, wherein the inner portion of the handle comprises a plurality of flat sides to frictionally interface with the positional portion of the retention spring mechanism to engage the handle in any of a plurality of positions.

10. A latching apparatus for mounting a computer module in a holding fixture, wherein the computer module comprises a baseboard and a faceplate, the latching apparatus comprising:
    a handle rotatably coupled to the baseboard, wherein the handle has an outer portion and an inner portion, wherein the outer portion includes a locking pin substantially parallel to the faceplate, and wherein the handle is movable between a latched position and an unlatched position;
    a retention spring mechanism having a latching portion and a positional portion, wherein the latching portion springably retains the handle in the latched position by engaging the locking pin, and wherein the positional portion frictionally interfaces with the inner portion of the handle to engage the handle in any of a plurality of positions; and a handle stop coupled to prevent the handle from opening past the unlatched position.

11. The latching apparatus of claim 10, wherein the retention spring mechanism is coupled to the baseboard.

12. The latching apparatus of claim 10, wherein the retention spring mechanism is coupled to the faceplate.

13. The latching apparatus of claim 10, wherein the handle stop is comprised of a stop tab.

14. The latching apparatus of claim 10, wherein the handle stop is integral with the inner portion of the handle.

15. The latching apparatus of claim 14, wherein the inner portion of the handle couples with the faceplate to prevent the handle from opening past the unlatched position.

16. The latching apparatus of claim 10, wherein the handle further comprises a switching element contact point coupled to engage a switching element affixed to the baseboard.

17. The latching apparatus of claim 10, wherein the baseboard is a printed circuit board.

18. The latching apparatus of claim 10, wherein the inner portion of the handle comprises a plurality of flat sides to frictionally interface with the positional portion of the retention spring mechanism to engage the handle in any of a plurality of positions.

19. A latching apparatus for mounting a computer module in a holding fixture, wherein the computer module comprises a printed circuit board and a faceplate, the latching apparatus comprising:

a handle rotatably coupled to the baseboard, wherein the handle has an outer portion and an inner portion, wherein the outer portion includes a locking pin substantially parallel to the faceplate, wherein the inner portion comprises a plurality of flat sides, and wherein the handle is movable between a latched position and an unlatched position;

a retention spring mechanism having a latching portion and a positional portion, wherein the latching portion springably retains the handle in the latched position by engaging the locking pin, and wherein the positional portion frictionally interfaces with the plurality of flat sides of the inner portion of the handle to engage the handle in any of a plurality of positions; and a handle stop coupled to prevent the handle from opening past the unlatched position, wherein the handle stop is integral with the inner portion of the handle, and wherein the inner portion of the handle couples with the faceplate to prevent the handle from opening past the unlatched position.

* * * * *